United States Patent
Bolde et al.

(10) Patent No.: US 7,168,609 B2
(45) Date of Patent: Jan. 30, 2007

(54) METHOD AND APPARATUS FOR REMOVING KNOWN GOOD DIE

(75) Inventors: Lannie R Bolde, New Paltz, NY (US); James H Covell, Poughkeepsie, NY (US); Mark W. Kapfhammer, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 10/235,007

(22) Filed: Sep. 3, 2002

(65) Prior Publication Data

US 2004/0041011 A1    Mar. 4, 2004

(51) Int. Cl.
 *B23K 31/02*    (2006.01)
(52) U.S. Cl. .................... 228/264; 228/13; 228/49.5
(58) Field of Classification Search ............... 228/264, 228/13–19, 49.5–119, 234.1; 310/333; 29/762
See application file for complete search history.

(56) References Cited

U.S. PATENT DOCUMENTS

| | | | |
|---|---|---|---|
| 4,561,584 A | | 12/1985 | Hug |
| 4,561,586 A | | 12/1985 | Abel et al. |
| 4,962,878 A | * | 10/1990 | Kent ..................... 228/49.5 |
| 5,553,766 A | | 9/1996 | Jackson et al. |
| 5,556,024 A | * | 9/1996 | Olson et al. ............... 228/264 |
| 5,620,132 A | | 4/1997 | Downing et al. |
| 5,702,051 A | * | 12/1997 | Leicht .................. 228/234.2 |
| 5,779,133 A | | 7/1998 | Jackson et al. |
| 5,782,403 A | * | 7/1998 | Wang ..................... 228/264 |
| 5,868,297 A | | 2/1999 | Zabel et al. |
| 6,163,014 A | * | 12/2000 | Bergeron et al. ......... 219/388 |
| 6,216,937 B1 | | 4/2001 | Delaurentis et al. |
| 6,333,491 B1 | * | 12/2001 | Bergeron et al. ......... 219/388 |

* cited by examiner

*Primary Examiner*—Jonathan Johnson
(74) *Attorney, Agent, or Firm*—Gibb I.P. Law Firm, LLC; James Cioffi, Esq.

(57) ABSTRACT

A method and structure is disclosed for detaching a chip from a substrate that delays the delivery of shear force to the chip until the connectors attaching the chip to the substrate are soft enough that the delivery of shear force will not damage the chip's connectors. More particularly, the shear force is created by a bimetallic disk that, when heat is applied, is transformed into shearing force. The shearing force is delayed by a delaying device until the connectors connecting the chip to the substrate are soft enough that the application of shear force will separate the chip from the substrate without damaging the chip's connectors. The delaying device includes a physical gap that may be adjusted to control when the shear force is applied to the chip.

18 Claims, 1 Drawing Sheet

METHOD AND APPARATUS FOR REMOVING KNOWN GOOD DIE

BACKGROUND OF THE INVENTION

1. Field of the Invention

The present invention generally relates to the removal of a die from a substrate and, more particularly, to using a bimetal removal apparatus to remove a die from a substrate.

2. Description of the Related Art

Advanced chips or die, such as, for example, high performance chips with increased logic complexity, require testing before the chips are assembled into final products. Conventional chip testing uses temporary electronic packages that allow all of the chip's input/output connectors to be simultaneously available for electronic testing. The chip's connectors are attached to the temporary electronic package's substrate via a controlled collapse chip connection (also known as C4), e.g., C4 solder balls.

Once the chip testing is completed, the chip must be separated from the temporary electronic testing package so that the C4's remain in tact and connected to the chip. This must be done without damaging the chip and, more specifically, without damaging the BLM (i.e., the solder ball limiting metallurgy) of each of the chip's connectors. The BLM defines the size and area of the soldered connection, limits the flow of the solder ball to the desired area, and provides adhesion and contact to the chip wiring. If the BLM of any connector is damaged during separation, the chip is considered damaged and/or unusable. Similarly, if, upon separation, the solder separates from the chip side connector (as opposed to the substrate side), the connector (and therefore the chip) is unusable.

The two types of conventional separating processes include cold shear, which is done at room temperature, and warm shear, done at an elevated temperature. Each of these processes shear the chip from a testing substrate by the application of static shearing force. In the case of cold shear, a direct and constant force is applied to the side of the chip. This operation is conventionally done as a bench top operation. In the case of warm shear, the C4 (i.e., the soldered connection) is heated (i.e., via a belt furnace). This limits the various options for applying shear force to stand alone fixtures that can pass through a belt furnace. To insure an even distribution of heat across the C4 array and substrate, fixture size and mass is also limited. Conventionally, springs are utilized to generate the shearing force. More specifically, the substrate is anchored in the fixture, the springs are compressed and the shear force is transferred to the C4 array. The fixture, loaded with product, is then heated and as the C4 (i.e., the soldered connection) is heated and softens (i.e., via a belt furnace), the chip shears away from the substrate.

However, the application of shearing force to the chip and the C4 ball array prior to the desired temperature often times results in damage to the BLM. Advanced chip testing requires 100% module yield. However, conventional separation techniques cannot consistently produce 100% module yield. The amount of damage and the number of damaged chips increases for example, the greater the number of connectors, the smaller the size of the connection pads, and/or the less uniform the connection material (as opposed to conventional solder), such as with advanced chips such as those with 5,000 or greater I/O and with interconnections on the order of 0.004" on 0.008" centers.

Conventional chip detach methods such as those disclosed in U.S. Pat. No. 5,553,766, entitled "In-situ Device Removal For Multi-chip Modules," U.S. Pat. No. 5,779,133, entitled "In-situ Device Removal For Multi-chip Modules," (a Divisional of '766), and U.S. Pat. No. 6,216,937, entitled "Process And Apparatus To Remove Closely Spaced Chips On A Multi-chip Module," (each incorporated herein by reference) teach the use of bimetallic disk or memory device to pull the chip from a package once the assembly reaches the solder softening point or, in other words, gripping and exerting a tensile force on the chip at different operating temperatures relative to the solder ball melting points. However, these detach techniques of gripping and pulling cannot guarantee that the BLM will not be damaged and/or that the solder balls will stay on the chip's connectors during and after chip detachment.

SUMMARY OF THE INVENTION

In view of the limitations of the conventional chip detach processes, the present invention provides a method and structure for detaching a chip from a substrate that delays the delivery of shear force to the chip until the connectors attaching the chip to the substrate are soft enough that the delivery of shear force will not damage the chip's connectors. More particularly, the shear force is created by a bimetallic disk that, when heat is applied, is transformed into shearing force. The shearing force is delayed by a delaying device until the connectors are soft enough that the application of shear force will separate the chip from the substrate without damaging the chip's connectors. The delaying device includes a physical gap that may be adjusted to reflect the timing of when the shear force is applied to the chip.

The timing of when the shear force is delivered to the chip and the amount of shear force delivered to the chip is temperature dependent. A test module or set up gage may be used to calibrate the shear force, the delay device, the delivery of the shear force, and/or the size of the physical gap.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Ordinary chip detachment occurs in stages. Initially, as the electronic module is heated in conjunction with static applied separation or shearing force, the weaker solder balls begin to separate while the remaining solder balls deform under an increasing shear force. As the connectors separate, the shearing force is then distributed among the remaining connectors.

Next, the shearing force reaches a critical point when the solder balls still attached to the electronic package can no longer support the shear load, and fail catastrophically under an increasing shearing force. The shearing force increases because, as the number of connections is reduced, the remaining shearing force is unequally focused on the remaining connectors. The result of the increased focused shearing force is an increase in shear rate. Since the effective mechanical strength of solder increases as the shear rate increases, some of the remaining solder balls with the largest resistance and which are among the last to detach from the electronic package, fail to separate properly, i.e., create damage to the BLM and/or do not separate on the chip side.

The present invention provides a method and structure for detaching a chip from a substrate that delays the delivery of shear force to the chip until the connectors attaching the chip to the substrate are thermally stabilized and soft enough that the delivery of shear force will not damage the chip's connectors. More particularly, the shear force is created by a bimetallic disk that, when heat is applied, is transformed into uniformly applied shearing force. The shearing force is delayed by a delaying device until the connectors connected the chip to the substrate are soft enough that the application of shear force will separate the chip from the substrate without damaging the chip's connectors. The delaying device includes a physical gap that may be adjusted to reflect the timing of when the shear force is applied to the chip.

The timing of when the shear force is delivered to the chip and the amount of shear force delivered to the chip is temperature dependent. Therefore, a temperature profile is designed to begin delivery of the shear force at a predetermined temperature that continues to increase based on time and temperature. This enables a programmable method to shear chips away from substrates. A test module may be used to calibrate the shear force, the delay device, the delivery of the shear force, and/or the size of the physical gap.

Figure 1:
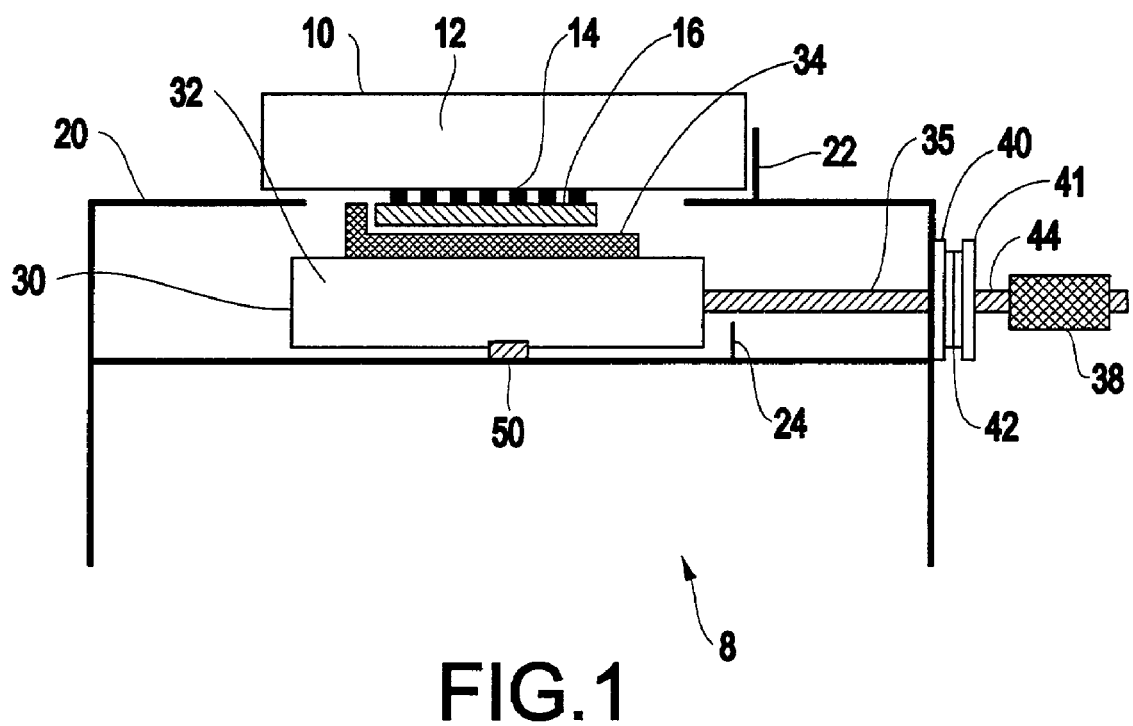
FIG. 1 is a schematic of an inventive chip detach apparatus with bimetallic discs prior to the application of heat.

The details of the current invention are best described with the help of the assembly schematic shown in FIG. 1, which includes: an electronic module 10 mounted on a metal carrier 20 engaged with a bimetallic device 30. In an alternative embodiment, electronic module 10 may include, but is not limited to, a substrate, a micro-electronic carrier, an electronic card and/or an electronic board.

The electronic module 10 includes an electronic package 12 and a chip 16 interconnected via an array of solder balls 14 (e.g. a C4 solder ball array). In an alternative embodiment of the present invention, chip 16 may include any number of electronic components or devices including, but not limited to capacitors, inductors, conductors, resistors, etc. In an alternative embodiment of the present invention, the electronic package 12 and the chip 16 may be interconnected by glass, attaching metals including, but not limited to dissimilar metals, bimetals, and/or trimetals, attaching compounds such as, but not limited to organic, inorganic, and/or polymeric compounds, thermally activated attachers, photosensitive attachers and/or ultraviolet sensitive attachers, etc., and any combination of the foregoing.

The electronic module 10 is mounted on metal carrier 20 against a first stop wall 22 which prevents the electronic package 12 from moving laterally in the direction of first stop wall 22. Lateral shearing force is applied to the chip 16 by engaging the chip 16 with the bi-metallic device 30 resulting in shearing force being applied to the C4 solder ball array.

The bimetallic device 30 includes a shear blade 34 attached to a slide block 32 which attaches to a load transfer rod 35 and includes a first rigid member (e.g., plate, washer, board, etc.) 40, a second rigid member (e.g., plate, washer, board, etc.) 41, a bimetal disk 42, and a screw-type (or other type) adjustable knob 38. First rigid member 40 is positioned against metal carrier 20 and enclosed within first rigid member 40 and the second rigid member 41 is the bimetal disk 42. The adjustable knob 38 is positioned a small distance from the second rigid member 42, thereby creating a gap 44. The size of gap 44 may be adjusted by engaging the adjustable knob 38.

In an alternative embodiment of the present invention, the load transfer rod comprises multiple bimetal disks, wherein the bimetal disks are separated and/or enclosed by rigid members. In a preferred embodiment of the present invention, metal carrier 20 includes pin 50 which fits into a lateral slot or groove within the metal carrier and is attached to the slide block 32 thereby ensuring the slide block's movement is limited to the direction of the load transfer rod 35 axis.

Figure 2:
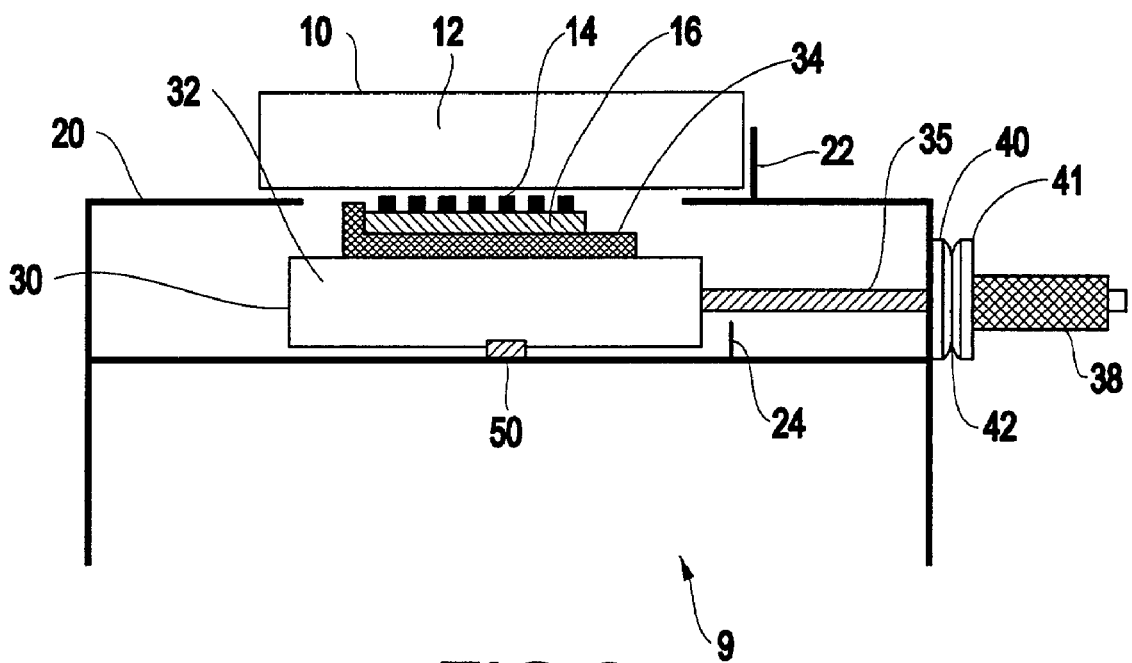
FIG. 2 is a schematic of an inventive chip detach apparatus with bimetallic discs during the application of heat.

FIG. 2 is an illustration of the assembly 8 illustrated in FIG. 1 after heat is applied to bimetal disk 42 and solder array 14. Bimetal disk 42 is a temperature activated body, wherein a change in temperature results in the bimetal disk 42 directly or indirectly exerting a shearing force on the chip 16.

More specifically, when heat is applied to the assembly 8, the bimetal disk 42 changes shape or "cups" which results in a lateral displacement force (i.e., along the load transfer rod axis) being exerted on the first and second washers. The first and second rigid members then exert a displacement force on the metal carrier 20 and the adjustable knob 38, but only after overcoming the gap 44. The displacement force on metal carrier 20 and adjustable knob 38 is then transferred to the load transfer rod 35 which carries the force to the slide block 32, which in turn directs the force to the shear blade 34 which then engages the chip 16. When the shear blade 34 contacts the chip 16, the chip 16 separates from the electronic package 12.

The amount of lateral displacement is a function of the bimetal material, the number of bimetal disks, the shape of the disks, the size of the disks, the thickness of the disks, the amount of heat applied, and the size of the gap 44. In an alternative embodiment of the present invention, by varying the quantity and/or thickness of the bimetal disk(s), any force and stroke length may be achieved.

In a preferred embodiment of the present invention, heat is delivered to the assembly 8 by loading the assembly in a furnace, such as, but not limited to a belt furnace or a batch furnace, where the chip 16 separates from the electronic package 12 when the temperature of the assembly is high enough to soften the solder ball array 14 and cause the bimetal disks to change shape in a liner direction. More specifically, the solder experiences a phase transformation as a result of the introduction of increased temperature. The solder goes from a solid state to a softer, more pliable, state.

In a preferred embodiment of the present invention, during the chip separation process, the maximum movement of bimetal device 30 is limited by a second stop wall 24, which engages the slide block 32 after the solder ball array 14 has been separated from the electronic package 12.

In a preferred embodiment of the present invention, the gap 44 (and/or the size of the gap) controls the time during a furnace profile at which the force is delivered to the chip 16. Thus, the delivery of shear force to the chip can be controlled to occur after the C4 solder ball array begins to melt, thereby avoiding damaging the chip's connectors.

The timing of when the shear force is delivered to the chip is calibrated by modifying the lateral size of gap 44, which is accomplished by engaging (turning) the adjustable knob 38. Thus, with the invention, the application of the shear force is not solely temperature dependent. Additionally, the timing of the application of the shear force can be delayed by increasing the size of the gap 44 so as to allow the solder connection to become softer, even after the assembly 8 has reached the (appropriate) separation temperature. Also, the timing can be reduced or eliminated to cause the force to be applied sooner (or immediately), depending upon the results of the calibration tests. By providing a timing control (after the appropriate temperature stability has been reached) an easily adjustable physical feature can be changed to suit specific manufacturing needs as they present themselves on the factory floor. Therefore, the invention allows the application of the shear force to be controlled at a level that has never been available before. With the invention, the yield rate is dramatically increased as the number of damaged electronic components (from shearing processes) is substantially decreased.

In addition, an adjustable load gauge can be used to calibrate the assembly 8. The load gauge is mounted on the metal carrier 20 in the same location where the electronic module 10 is later loaded, and the gap size 44 is adjusted using the adjustable knob 38. However, before adjusting the gap size 44, the location of the load gauge must be adjusted, using the electronic module 10 as reference, to a position which will take into account the manufacturing tolerances of the electronic module 10.

While the invention has been described in terms of preferred embodiments, those skilled in the art will recognize that the invention can be practiced with modification within the spirit and scope of the appended claims.

What is claimed is:

1. A device removal apparatus comprising:
   a first member adapted to laterally contact a device to be removed from a substrate and to apply a shear force to said device, wherein said substrate has a longitudinal axis and said device is attached to a surface of said substrate that is parallel to said longitudinal axis, and wherein said first member is adapted to move in a direction parallel to said longitudinal axis to apply said shear force to said device so as to slide said device along said surface of said substrate;
   a temperature activated body connected to said first member and being adapted to deliver said shear force to said device through said first member; and
   an adjustable delay device connected to said first member and being adapted to delay delivery of said shear force.

2. The apparatus of claim 1, wherein said temperature activated body includes a bimetal disk.

3. The apparatus of claim 1, wherein a gap exists between said temperature activated body and said adjustable delay device.

4. The apparatus of claim 3, wherein said adjustable delay device includes an adjustment knob adapted to adjust the size of said gap.

5. The apparatus of claim 1, wherein said apparatus comprises a test module, wherein said test module calibrates said delay device.

6. The apparatus of claim 3, wherein said apparatus comprises a test module, wherein said test module calibrates the size of said gap.

7. The apparatus of claim 1, wherein said delay device prevents said first member from damaging said device by delaying delivery of said shear force.

8. A device removal apparatus comprising:
   a first member adapted to laterally contact a device to be removed from a substrate and to apply a shear force to said device, wherein said substrate has a longitudinal axis and said device is attached to a surface of said substrate that is parallel to said longitudinal axis, and wherein said first member is adapted to move in a direction parallel to said longitudinal axis to apply said shear force to said device so as to slide said device along said surface of said substrate;
   a bimetal disk connected to said first member and being adapted to deliver said shear force to said device through said first member;
   delay device adjacent said bimetal disk; and
   a gap between said bimetal disk and said delay device, wherein said gap delays delivery of said shear force.

9. The apparatus of claim 8, further comprising an adjustment knob adjacent said bimetal disk adapted to adjust the size of said gap.

10. The apparatus of claim 8, wherein said apparatus comprises a test module, and wherein said test module calibrates said gap.

11. The apparatus of claim 8, wherein said gap prevents said first member from damaging said device by delaying delivery of said shear force.

12. A device removal apparatus comprising:
    a first member adapted to contact a device to be removed from a substrate and to apply a force to said device;
    a temperature activated body adapted to deliver said force to said device through said first member, and
    a delay device connected to said first member,
    wherein said delay device is adapted to contact said temperature activated body,
    wherein a gap exists between said temperature activated body and said delay device; and
    wherein said force delivered from said temperature activated body to said first member is delayed by said gap.

13. The apparatus of claim 12, wherein a size of said gap adjusts an amount that said force is delayed from being delivered to said device.

14. The apparatus of claim 12, wherein said temperature activated body expands when heated.

15. The apparatus of claim 12, wherein said temperature activated body comprises a bimetal disk.

16. The apparatus of claim 12, further comprising an adjustment knob connected to said delay device, wherein said adjustment knob is adapted to adjust a size of said gap.

17. The apparatus of claim 12, wherein said delay device prevents said first member from damaging said device by delaying delivery of said force.

18. The apparatus af claim 12, wherein said force is delayed by said gap during a time when said device and said device removal apparatus are being heated.

* * * * *